United States Patent
Yates et al.

(10) Patent No.: US 10,778,285 B2
(45) Date of Patent: Sep. 15, 2020

(54) CABLE WITH INTEGRAL SENSING ELEMENTS FOR FAULT DETECTION

(71) Applicant: GoLock Technology, Inc., Spicewood, TX (US)

(72) Inventors: Douglas A. Yates, Spicewood, TX (US); Steven R. Jones, Spicewood, TX (US); Frank Murtland, Fort Worth, TX (US); Edward J. Gross, Austin, TX (US)

(73) Assignee: Go Lock Technology, Inc., Spicewood, TX (US)

( * ) Notice: Subject to any disclaimer, the term of this patent is extended or adjusted under 35 U.S.C. 154(b) by 0 days.

(21) Appl. No.: 16/475,750

(22) PCT Filed: Jan. 4, 2018

(86) PCT No.: PCT/US2018/012369
§ 371 (c)(1),
(2) Date: Jul. 3, 2019

(87) PCT Pub. No.: WO2018/129178
PCT Pub. Date: Jul. 12, 2018

(65) Prior Publication Data
US 2019/0334578 A1    Oct. 31, 2019

Related U.S. Application Data

(60) Provisional application No. 62/442,309, filed on Jan. 4, 2017.

(51) Int. Cl.
*H04B 3/46* (2015.01)
*H01B 7/04* (2006.01)
(Continued)

(52) U.S. Cl.
CPC .............. *H04B 3/46* (2013.01); *G01R 31/58* (2020.01); *H01B 7/04* (2013.01); *H01B 7/32* (2013.01); *H04B 10/40* (2013.01)

(58) Field of Classification Search
CPC . H04B 3/46; H04B 10/40; H01B 7/04; H01B 7/32; G01R 31/021
(Continued)

(56) References Cited

U.S. PATENT DOCUMENTS

| | | |
|---|---|---|
| 2,963,895 A | 12/1960 | Thomas |
| 3,754,419 A | 8/1973 | Taylor |

(Continued)

FOREIGN PATENT DOCUMENTS

| | | |
|---|---|---|
| CN | 103896122 A | 7/2014 |
| EP | 2299251 A1 | 3/2011 |

(Continued)

OTHER PUBLICATIONS

USPTO as International Searching Authority (ISA); International Search Report and Written Opinion of the ISA; pp. 1-12; dated Jun. 6, 2017 (dated Jun. 6, 2017) (USPTO Alexandria, Virginia US) .

(Continued)

*Primary Examiner* — Jerry M Blevins
(74) *Attorney, Agent, or Firm* — Culhane Meadows PLLC

(57) ABSTRACT

Disclosed herein are cable systems that include a cable defining a sensing path and comprising a working strand and one or more sensing strands, a signal source to impart a test signal between a first terminal and a second terminal, a sensor to detect the test signal, a transmitter to transmit the test signal to a receiver, and an indicator to generate a display indicative of the test signal. Certain preferred embodiments describe sensing strands that are arranged in alternating concentric layers and/or extend lengthwise in loops. Such configurations facilitate the detection of break- (Continued)

age, insults, excess tension, or excess bending in the cable. The sensing strands may include a fixed resistor to establish a known resistance and facilitate the detection of small resistive changes.

14 Claims, 3 Drawing Sheets

(51) Int. Cl.
    *H01B 7/32*     (2006.01)
    *H04B 10/40*     (2013.01)
    *G01R 31/58*     (2020.01)

(58) Field of Classification Search
    USPC .......................................................... 375/219
    See application file for complete search history.

(56) References Cited

U.S. PATENT DOCUMENTS

| | | |
|---|---|---|
| 4,027,276 A | 5/1977 | Shaughnessy |
| 4,032,848 A | 6/1977 | Shaughnessy |
| 4,095,211 A | 6/1978 | Shaughnessy |
| 4,188,614 A | 2/1980 | Habib, Jr. |
| 4,229,811 A | 10/1980 | Salem |
| 4,242,743 A | 12/1980 | Salem |
| 4,260,928 A | 4/1981 | Salem |
| 4,531,115 A | 7/1985 | Black et al. |
| 4,538,107 A | 8/1985 | Varone |
| 4,576,022 A | 3/1986 | Gamble |
| 4,626,799 A | 12/1986 | Matievic |
| 4,672,365 A | 6/1987 | Gehman et al. |
| 4,682,155 A | 7/1987 | Shirley |
| 4,734,680 A | 3/1988 | Gehman et al. |
| 4,737,771 A | 4/1988 | Coash |
| 4,755,792 A | 7/1988 | Pezzolo et al. |
| 4,965,909 A | 6/1990 | Matievic |
| 5,066,943 A | 11/1991 | Demirel |
| 5,268,670 A | 12/1993 | Brasch et al. |
| 5,477,152 A * | 12/1995 | Hayhurst ............. G01R 31/024 |
| | | 324/133 |
| 5,699,065 A | 12/1997 | Murray |
| D391,469 S | 3/1998 | Foushee |
| 5,852,402 A * | 12/1998 | Perry ................... G08B 13/122 |
| | | 340/541 |
| 5,881,582 A | 3/1999 | Moncao |
| 5,898,397 A | 4/1999 | Murray |
| 5,959,532 A * | 9/1999 | Fujiuchi ............. G08B 13/1463 |
| | | 340/572.1 |
| 6,166,644 A | 12/2000 | Stroda |
| 6,439,008 B1 | 8/2002 | Keil |
| 6,570,498 B1 | 5/2003 | Frost et al. |
| 6,578,393 B2 | 6/2003 | Yarborought |
| 6,684,668 B1 | 2/2004 | Hsueh Lee |
| 6,720,861 B1 | 4/2004 | Rodenbeck et al. |
| 6,731,908 B2 | 5/2004 | Berliner et al. |
| 6,813,770 B1 | 10/2004 | Pereira et al. |
| 6,859,761 B2 | 2/2005 | Bensky et al. |
| 6,961,541 B2 | 11/2005 | Overy et al. |
| 6,963,289 B2 | 11/2005 | Aljadeff et al. |
| 6,968,194 B2 | 11/2005 | Aljadeff et al. |
| D523,729 S | 6/2006 | Gorst |
| D527,296 S | 8/2006 | Concari |
| 7,104,091 B2 | 9/2006 | Kuhblank |
| 7,123,030 B2 | 10/2006 | Robar et al. |
| 7,155,783 B2 | 1/2007 | Nessel et al. |
| 7,178,205 B2 | 2/2007 | Nessel et al. |
| D539,181 S | 3/2007 | Concari |
| D545,710 S | 7/2007 | Concari |
| D545,760 S | 7/2007 | Concari |
| 7,253,733 B2 | 8/2007 | Krieger |
| 7,274,293 B2 | 9/2007 | Bradus et al. |
| 7,295,115 B2 | 11/2007 | Aljadeff et al. |
| 7,296,447 B2 | 11/2007 | Priest et al. |
| 7,308,809 B2 | 12/2007 | Lu |
| 7,319,395 B2 | 1/2008 | Puzio et al. |
| 7,319,398 B2 | 1/2008 | Marino |
| 7,337,963 B2 | 3/2008 | Harper et al. |
| 7,339,475 B2 | 3/2008 | Concari et al. |
| 7,339,477 B2 | 3/2008 | Puzio et al. |
| 7,343,328 B1 | 3/2008 | Smith et al. |
| 7,391,315 B2 | 6/2008 | Friar |
| 7,391,326 B2 | 6/2008 | Puzio et al. |
| 7,392,673 B2 | 7/2008 | Fawcett et al. |
| 7,403,108 B2 | 7/2008 | Aljadeff et al. |
| D581,303 S | 11/2008 | Concari |
| 7,454,826 B2 | 11/2008 | Nessel et al. |
| 7,525,411 B2 | 4/2009 | Strader et al. |
| 7,543,467 B2 | 6/2009 | Sheehan |
| 7,648,065 B2 | 1/2010 | Marino |
| 7,649,464 B2 | 1/2010 | Puzio et al. |
| 7,665,289 B2 | 2/2010 | DeAngelis |
| 7,669,765 B2 | 3/2010 | Harper et al. |
| 7,675,413 B2 | 3/2010 | Watts et al. |
| 7,692,542 B2 | 4/2010 | Outzs |
| 7,750,811 B2 | 7/2010 | Puzio et al. |
| 7,753,272 B2 | 7/2010 | Harper et al. |
| 7,832,064 B2 | 11/2010 | Nessel et al. |
| 7,866,245 B2 | 1/2011 | Kempf et al. |
| 7,916,036 B1 | 3/2011 | Pope et al. |
| 7,926,215 B2 | 4/2011 | Riker et al. |
| 7,961,088 B2 | 6/2011 | Watts et al. |
| D640,911 S | 7/2011 | Yang |
| D642,119 S | 7/2011 | Baetica et al. |
| 7,986,228 B2 | 7/2011 | Friar et al. |
| 8,002,180 B2 | 8/2011 | Harper et al. |
| 8,056,945 B2 | 11/2011 | Moreno |
| 8,103,047 B1 | 1/2012 | Griess et al. |
| 8,218,810 B1 | 7/2012 | Griess et al. |
| 8,248,226 B2 | 8/2012 | Fiar |
| 8,264,322 B2 | 9/2012 | Rodenbeck et al. |
| 8,313,024 B2 | 11/2012 | Marino |
| 8,358,198 B2 | 1/2013 | Harper et al. |
| 8,360,208 B2 | 1/2013 | DeAngelis |
| 8,531,286 B2 | 9/2013 | Friar et al. |
| 8,665,064 B1 | 3/2014 | Rodenbeck et al. |
| 8,707,745 B2 | 4/2014 | Kalous |
| 8,746,074 B2 | 6/2014 | Lambert |
| 8,839,649 B1 | 9/2014 | Miller et al. |
| 8,850,858 B2 | 10/2014 | Nave |
| 8,870,078 B2 | 10/2014 | Webb et al. |
| D719,012 S | 12/2014 | Alexander |
| 8,928,463 B2 | 1/2015 | Landau et al. |
| D731,873 S | 6/2015 | Harder |
| 9,089,952 B2 | 7/2015 | Gatling et al. |
| 9,115,511 B1 | 8/2015 | Schmidt et al. |
| 9,189,663 B2 | 11/2015 | Goren et al. |
| 9,390,572 B2 | 7/2016 | Almomani |
| 9,406,181 B2 | 8/2016 | Almomani |
| 9,424,700 B2 | 8/2016 | Lovett et al. |
| 9,449,268 B2 | 9/2016 | Goren et al. |
| 9,547,965 B2 | 1/2017 | Goren et al. |
| 9,633,551 B2 | 4/2017 | Aljadeff et al. |
| 9,639,722 B2 | 5/2017 | Landau et al. |
| 9,672,708 B2 | 6/2017 | Goren et al. |
| 9,691,207 B2 | 6/2017 | Almomani |
| 9,697,302 B2 | 7/2017 | Nguyen et al. |
| 2003/0228846 A1 | 12/2003 | Berliner et al. |
| 2004/0066202 A1* | 4/2004 | Pereira ................ G01R 31/021 |
| | | 324/539 |
| 2004/0083776 A1 | 5/2004 | Rosenberg |
| 2004/0119583 A1 | 6/2004 | Linden et al. |
| 2005/0079756 A1 | 4/2005 | Kawai et al. |
| 2005/0116120 A1 | 6/2005 | Maruyama |
| 2005/0242246 A1 | 11/2005 | Maruyama |
| 2006/0109103 A1 | 5/2006 | Bradus |
| 2006/0123229 A1 | 6/2006 | Holloway et al. |
| 2006/0139861 A1 | 6/2006 | Krieger et al. |
| 2006/0272365 A1 | 12/2006 | Copus |
| 2006/0283216 A1 | 12/2006 | Marcelle et al. |
| 2007/0262853 A1 | 11/2007 | Bradus et al. |
| 2008/0034817 A1 | 2/2008 | Chan |
| 2008/0068159 A1 | 3/2008 | Bradus et al. |

(56) References Cited

U.S. PATENT DOCUMENTS

| | | |
|---|---|---|
| 2008/0126126 A1 | 5/2008 | Ballai |
| 2008/0242945 A1 | 10/2008 | Gugliotti et al. |
| 2009/0033491 A1 | 2/2009 | Saunders |
| 2009/0102610 A1 | 4/2009 | Lance |
| 2009/0160427 A1 | 6/2009 | Drake et al. |
| 2009/0236486 A1 | 9/2009 | Matsuno et al. |
| 2009/0273465 A1 | 11/2009 | Shamir et al. |
| 2010/0033325 A1 | 2/2010 | Vilkomirski et al. |
| 2011/0195701 A1 | 8/2011 | Cook et al. |
| 2011/0203327 A1 | 8/2011 | Fong |
| 2011/0203329 A1 | 8/2011 | Fong |
| 2011/0283753 A1 | 11/2011 | Triffle |
| 2014/0020295 A1 | 1/2014 | Bonahoom et al. |
| 2014/0113563 A1 | 4/2014 | Almomani et al. |
| 2014/0157842 A1 | 6/2014 | Almomani et al. |
| 2014/0176305 A1 | 6/2014 | Aljadeff |
| 2014/0267740 A1 | 9/2014 | Almomani et al. |
| 2015/0091696 A1 | 4/2015 | Fisher |
| 2015/0197408 A1 | 7/2015 | St. Germain |
| 2016/0110637 A1 | 4/2016 | Lehovetzki |
| 2016/0117899 A1 | 4/2016 | Chevalier et al. |
| 2016/0140432 A1 | 5/2016 | Lehovetzki |
| 2017/0058565 A1 | 3/2017 | Sanchez et al. |
| 2017/0098335 A1 | 4/2017 | Payack, Jr. |
| 2017/0206385 A1 | 7/2017 | Barney |

FOREIGN PATENT DOCUMENTS

| | | |
|---|---|---|
| WO | WO 2005/028790 A1 | 3/2005 |
| WO | WO 2014/012564 A1 | 1/2014 |
| WO | WO 2014/012677 A1 | 1/2014 |
| WO | WO 2017/123949 A1 | 7/2017 |

OTHER PUBLICATIONS

Attorney for Go Lock Technology, Inc.; Amendments under Article 34; total of 14 pages; submitted in International Application PCT/US2017/018215 "Portable Lock with Integrity Sensors" dated Sep. 15, 2017 (dated Sep. 15, 2017) (USPTO Alexandria Virginia US).

USPTO as International Searching Authority (ISA); International Preliminary Report on Patentability; pp. 1-4; dated Feb. 5, 2018 (dated Feb. 5, 2018) (USPTO Alexandria, Virginia US).

USPTO as International Searching Authority (ISA); International Search Report and Written Opinion of the ISA; pp. 1-8; dated Mar. 26, 2018 (dated Mar. 26, 2018) (USPTO Alexandria, Virginia US).

USPTO; Office Action (non-final); issued for U.S. Appl. No. 29/589,832, filed by Keller et al.; submitting cover page, Office Action Summary, Detailed Action, and Notice of References Cited; total of 5 pages; relevant passages include those on pp. 3-4; dated Nov. 1, 2017 (dated Nov. 1, 2017) (USPTO Alexandria, Virginia).

Attorney for Keller et al.; Amendment and Response to Office Action; total of 6 pages; relevant passages include those on pp. 2-6; submitted in U.S. Appl. No. 29/589,832 dated Jan. 26, 2018 (dated Jan. 26, 2018) (USPTO Alexandria, Virginia).

USPTO; Notice of Allowance; issued for U.S. Appl. No. 29/589,832, filed by Keller et al.; submitting Notice of Allowance and Fee(s) Due and Notice of Allowability for Design Application; total of 6 pages; relevant passages include those on pp. 5-6; dated Feb. 26, 2018 (dated Feb. 26, 2018) (USPTO Alexandria, Virginia).

CIPO (Canada Intellectual Property Office;); Examiner's Report; issued for Canada Application 175,754; total of 2 pages; relevant passages include those on pp. 1-2; dated Feb. 20, 2018 (dated Feb. 20, 2018) (CIPO Gaineau, Québec, Canada).

Attorney for Go Lock Technology, Inc.; Letter with amendments; total of 12 pages; relevant passages include those on pp. 1-12; submitted in Canada Application 175,754 dated Apr. 15, 2018 (dated May 14, 2018) (CIPO Gaineau, Québec, Canada).

Attorney for Keller et al.; Preliminary Amendment; total of 16 pages; submitted in U.S. Appl. No. 29/648,661 (a Continuation of U.S. Appl. No. 29/589,832) dated May 23, 2018 (dated May 23, 2018) (USPTO Alexandria, Virginia).

DeWalt DS500S MobileLock Portable Alarm with GPS, "Product & Accessories," archived webpage at http://www.DeWaltMobileLock.com:80/product -overview-and-specs, dated Nov. 8, 2014 (Nov. 8, 2014) captured via Internet Archive (https://web.archive.org).

DeWalt MobileLock "Portable Alarm Features," archived webpage at http://www.DeWaltMobileLock.com:80/product -portable-alarm-features, dated Nov. 19, 2014 (Nov. 19, 2014) captured via Internet Archive (https://web.archive.org).

USPTO; Notice of Allowance; issued for U.S. Appl. No. 15/998,905, filed by Yates, et al.; submitting Notice of Allowance and Fee(s) Due and Notice of Allowability; total of 8 pages; dated Mar. 4, 2020 (dated Mar. 4, 2020) (USPTO Alexandria, Virginia).

USPTO; Examiner-Initiated Interview Summary; U.S. Appl. No. 15/984,283, filed by Yates, et al.; tota of 1 page; dated Sep. 9, 2019 (dated Sep. 9, 2019) (USPTO Alexandria, Virginia).

USPTO; Notice of Allowance; issued for U.S. Appl. No. 15/984,283, filed by Yates, et al.; submitting Notice of Allowance and Fee(s) Due and Notice of Allowability; total of 7 pages; dated Sep. 18, 2019 (dated Sep. 18, 2019) (USPTO Alexandria, Virginia).

* cited by examiner

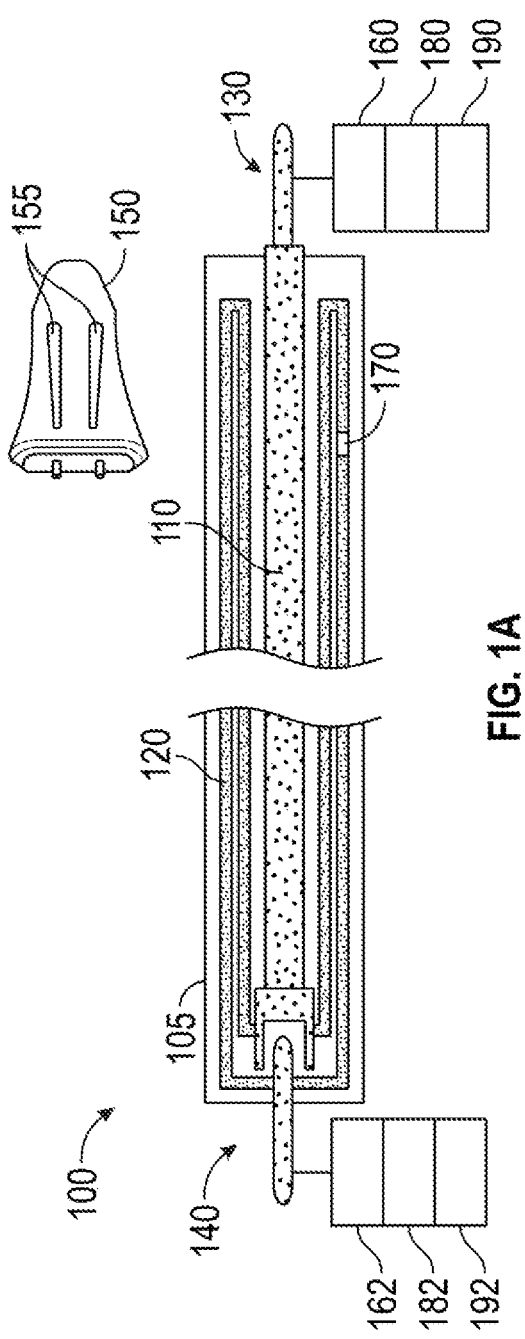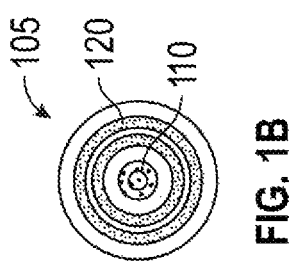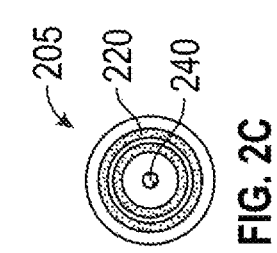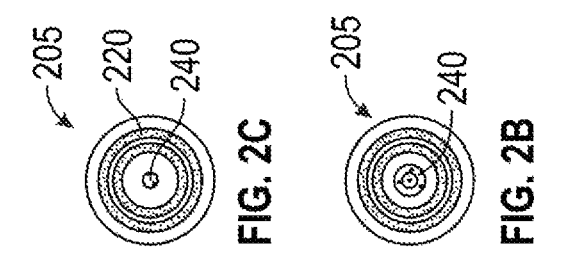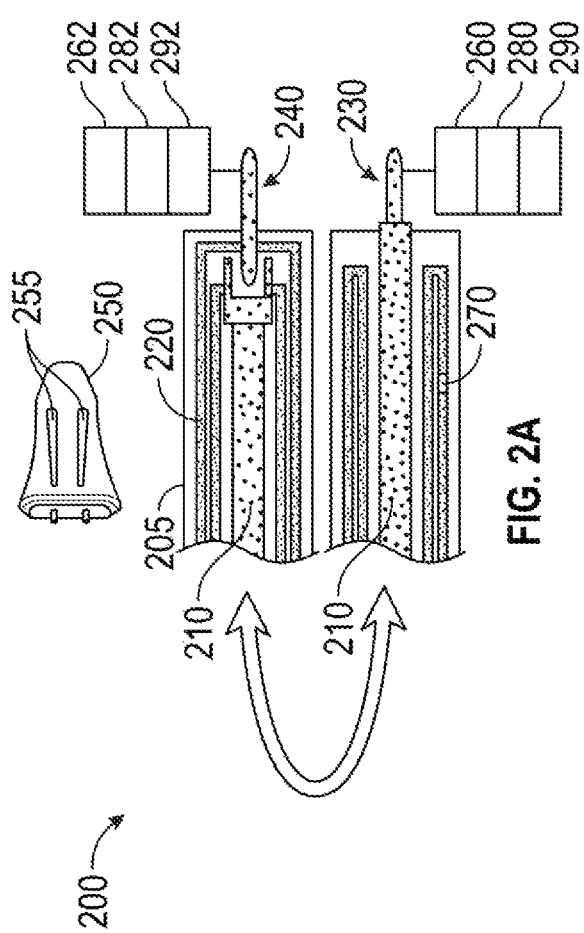

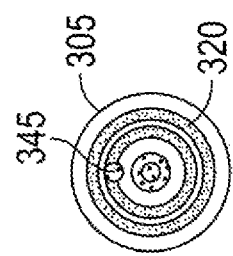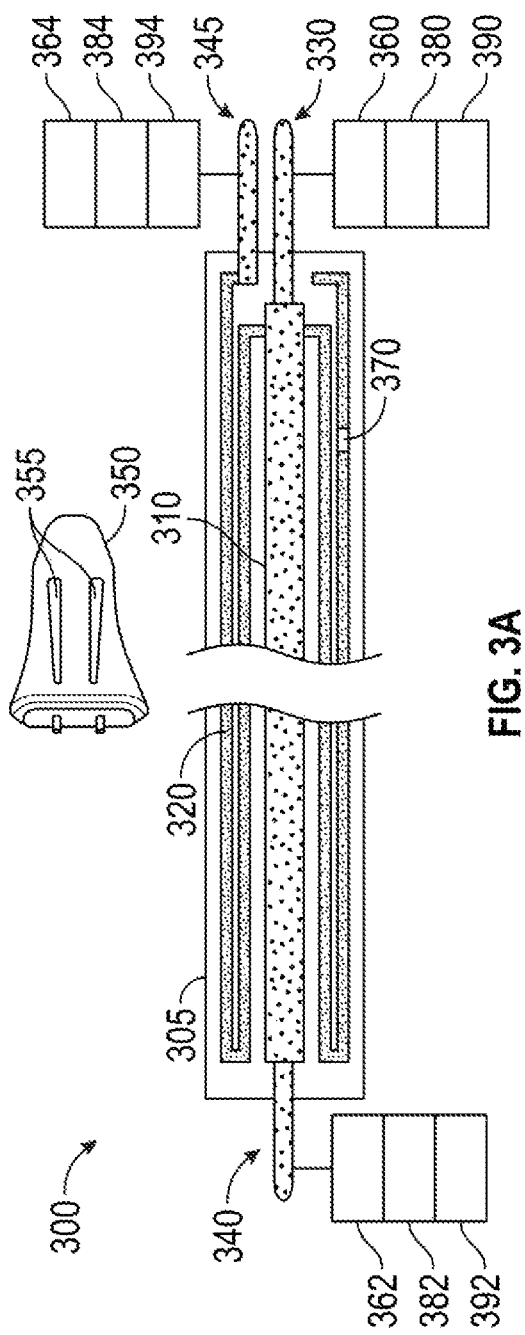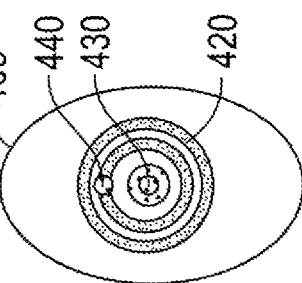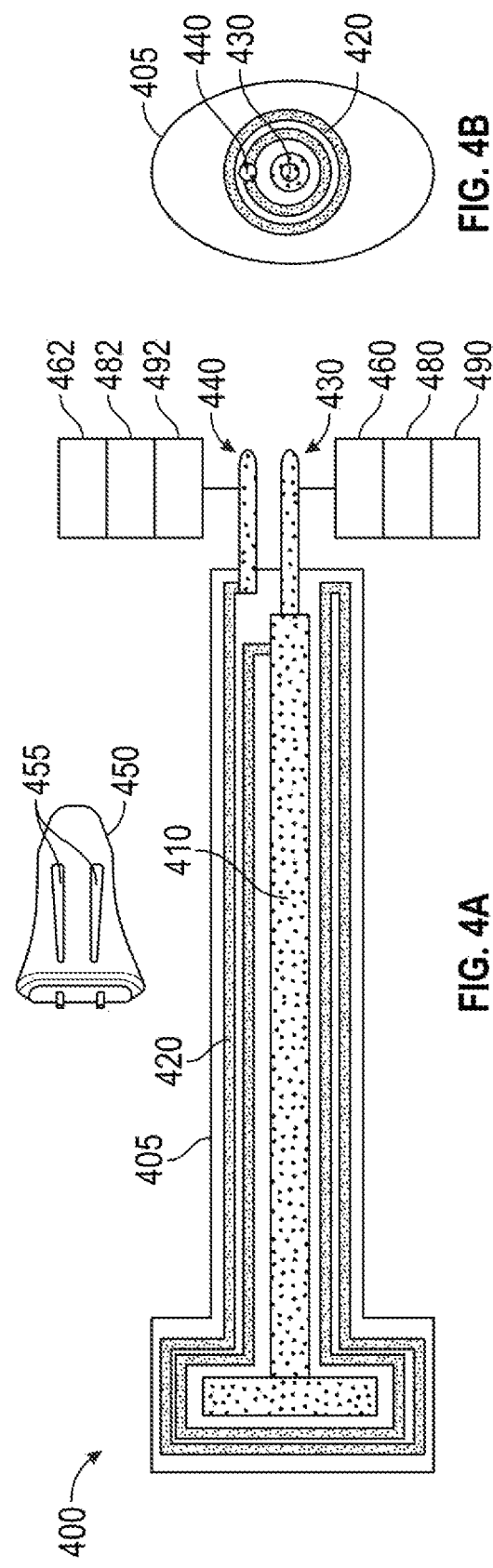

CABLE WITH INTEGRAL SENSING ELEMENTS FOR FAULT DETECTION

CROSS-REFERENCE TO RELATED APPLICATIONS

The present application claims the benefit of and priority to U.S. Provisional Application No. 62/442,309, filed Jan. 4, 2017, entitled "Cable with Integral Sensing Elements for Fault Detection" which is incorporated herein by reference in its entirety.

TECHNICAL FIELD

Certain disclosed embodiments relate to the field of cables and, more specifically, to multi-strand cable systems.

BACKGROUND

Several types of existing cables include one or more strands having a lesser tensile strength than the cable overall. The lesser-strength strands are typically designed to fail in response to an excessive force; before such a force causes failure of the cable. These strands are sometimes configured to carry an electrical signal. Upon failure, the broken strands will stop conducting the signal and may provide a pre-failure signal to the user. These strands, however, typically provide no indication of the main cable condition in non-failure situations.

Other cable systems include strain gauges, magnetometers, or other sensors for detecting changes in the condition of the cable. These monitoring systems are typically complex and expensive, involving a number of additional components, many of which are external to the main cable itself.

Thus, there is a need in the art for improved cables and cable systems.

SUMMARY

The disclosure features cable systems that include a cable, a first terminal, a second terminal, and a receiver with an indicator. The cable may include one or more working strands connected to one or more sensing strands to define a sensing path. The first terminal may be operably connected to the sensing path and may include a first signal source supported by a power source and configured to impart a test signal into the sensing path. The second terminal may be operably connected to the sending path and may include a second sensor and a second transceiver, wherein the second sensor is configured to detect the test signal and the second transceiver is configured to transmit the test signal. The receiver may be in communication with the second transceiver and may include an indicator.

The first terminal may further include a first sensor and a first transceiver.

The second terminal may further include a second signal source.

The receiver may be in wireless communication with at least one of the first and second transceivers.

The indicator may be selected from the group consisting of a lamp, a loudspeaker, and a vibrator. In this aspect, the indicator may produce an indication that is visual, audible, or tactile.

In an exemplary arrangement, the first terminal may include a first pin that is sized and shaped to be selectively received with a corresponding first receptacle in the receiver and the second terminal may include a second pin sized and shaped to be selectively received with a corresponding second receptacle in the receiver, such that the receiver is in wired communication with at least one of the first and second transceivers.

The cable system may include a fixed resistor positioned in series with the one or more sensing strands, the resistor configured to establish a known resistance along the sensing path. The second sensor may be configured to detect an actual resistance along the sensing path in response to the test signal, and may be further configured to send a fault message to the receiver when the actual resistance is different from the known resistance.

The cable system may further include an auxiliary terminal that is operably connected to the sensing path, positioned near the first terminal, and configured to substantially duplicate the functions and operation of the second terminal.

BRIEF DESCRIPTION OF THE DRAWING

Features of the various embodiments disclosed will become more apparent in the following detailed description, in which reference is made to the appended drawing figures, which are incorporated in and constitute a part of this specification. For the purpose of illustration, the drawing figures show embodiments that are presently preferred; however, the invention is not limited to the precise arrangements and instrumentalities shown. In the drawing:

FIG. 1A is a schematic, side view of a cable system in accordance with a first preferred embodiment.

FIG. 1B is a schematic, end view of a cable system in accordance with the first preferred embodiment.

FIG. 2A is a schematic, side view of a cable system in accordance with a second preferred embodiment.

FIG. 2B is a schematic, end view of a first end of a cable system in accordance with the second preferred embodiment.

FIG. 2C is a schematic, end view of a second end of a cable system in accordance with the second preferred embodiment.

FIG. 3A is a schematic, side view of a cable system in accordance with a third preferred embodiment.

FIG. 3B is a schematic, end view of a cable system in accordance with the third preferred embodiment.

FIG. 4A is a schematic, side view of a cable system in accordance with a fourth preferred embodiment.

FIG. 4B is a schematic, end view of a cable system in accordance with the fourth preferred embodiment.

Corresponding reference numbers indicate corresponding parts or elements throughout the several views of the drawing.

DETAILED DESCRIPTION OF VARIOUS EMBODIMENTS

Figure 5A:
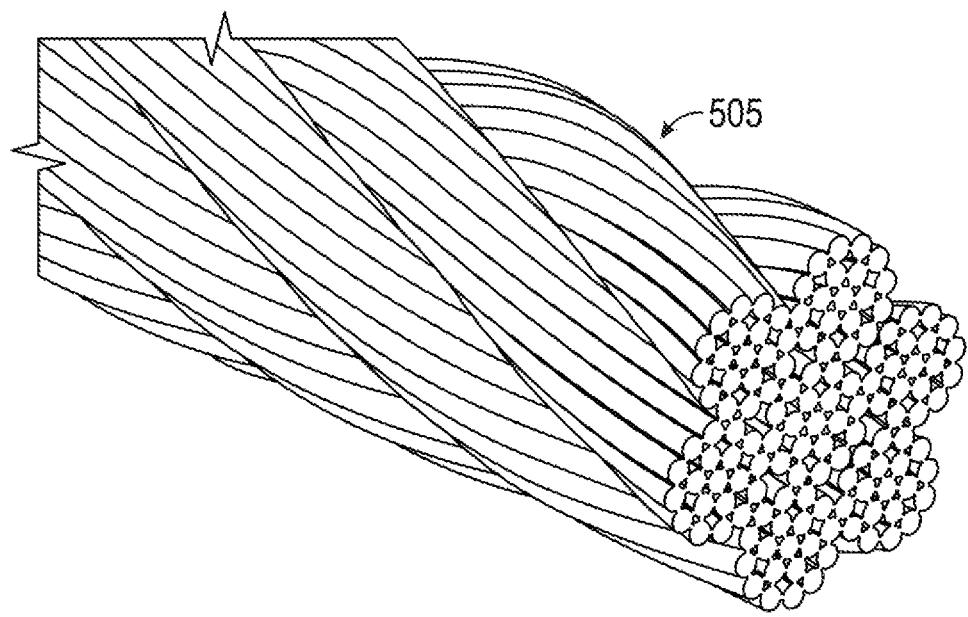
FIG. 5A is a schematic, side view of a cable system in accordance with a fifth preferred embodiment.

The present systems and apparatuses and methods are understood more readily by reference to the following detailed description, examples, drawings, and claims, and their previous and following description. However, before the present devices, systems, and/or methods are disclosed and described, it is to be understood that this invention is not limited to the specific devices, systems, and/or methods disclosed unless otherwise specified, as such can, of course, vary. It is also to be understood that the terminology used herein is for the purpose of describing particular aspects only and is not intended to be limiting.

Like parts are marked throughout the following description and drawings with the same reference numerals. The drawings may not be to-scale and certain features may be shown exaggerated in scale or in somewhat schematic format in the interest of clarity, conciseness, and to convey information.

The following description of the invention is provided as an enabling teaching of the invention in its best, currently known embodiment. To this end, those skilled in the relevant art will recognize and appreciate that many changes can be made to the various aspects of the invention described herein, while still obtaining the beneficial results of the present invention. It will also be apparent that some of the desired benefits of the present invention can be obtained by selecting some of the features of the present invention without utilizing other features. Accordingly, those who work in the art will recognize that many modifications and adaptations to the present invention are possible and can even be desirable in certain circumstances and are a part of the present invention. Thus, the following description is provided as illustrative of the principles of the present invention and not in limitation thereof.

As used throughout, the singular forms "a," "an" and "the" include plural referents unless the context clearly dictates otherwise. Thus, for example, reference to a component can include two or more such components unless the context indicates otherwise.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

As used herein, the terms "optional" or "optionally" mean that the subsequently described event or circumstance may or may not occur, and that the description includes instances where said event or circumstance occurs and instances where it does not.

Although many of the systems and methods described herein are discussed in the context of a cable for use with a portable locking device for securing personal property, the technology disclosed herein is also useful and applicable in a variety of other contexts. For example, the cable systems described herein would be useful and applicable for all types of systems where there is a need or desire to monitor the condition of one or more cables, including cables used in transportation (elevators, automobiles, aircraft, spacecraft, watercraft, agricultural equipment, train locomotives, cable cars, and the like), in manufacturing and industrial processes (drilling, mining, conveyors, robots, hoists and lifts, and the like), and in heavy-duty applications (lifting, hoisting, towing, winching, mooring, and the like). Cable systems with sensing elements may be particularly useful for cables that are subjected to repetitive motion and/or extreme environmental conditions (water, toxic chemicals, UV radiation, nuclear process radiation, and other harsh elements). Remote monitoring of cable systems may be particularly useful for cables that are placed in remote locations where routine or periodic inspection is difficult, expensive, or impossible.

The term "cable" as used herein refers to generally elongate rope or wire. The cable may be made of natural material, synthetic material, or a combination in any suitable proportion of natural and synthetic materials. The cable may include material that is laid, wound, braided, plaited, or otherwise interlaced according to structures known in the art.

The term "strands" as used herein refers to generally elongate cable elements such as a threads, yarns, filaments, fibers, cords, and wires, but also refers to and includes cable elements that are formed into or shaped like bands, strips, or ribbons.

First Embodiment

Referring to FIG. 1A and FIG. 1B, a cable system 100 according to a first preferred embodiment is illustrated. The cable 105, as shown, may include one or more working strands 110 and one or more sensing strands 120. Together, the strands 110, 120 define a sensing path. The strands 110, 120 may be comprised of one or more conductive wires. Accordingly, the strands 110, 120 are capable of transmitting an electrical signal between a first terminal 130 and a second terminal 140. The terminals 130, 140 are operably connected to the cable 105 and preferably, but not necessarily, connected to opposing ends of the cable 105. The terminals 130, 140 may be connected at locations between the opposing ends of the cable 105.

The working strands 110 are described as active or working because they are engaged in performing one or more functions of the cable system 100, such as providing structural support, conveying a mechanical force (for lifting or towing, for example), or carrying an electric current or signal.

The working strands 110 and/or the sensing strands 120 may be fully conductive (such as copper wire, ferrous wire, metal foil, wound wire, or other conductive flexible material) or partially conductive (such as resistive wire, carbon filament, carbon-impregnated rubber, synthetic, or other partially-conductive material)—or some combination of both types. The sensing strands 120 may be insulated and/or electrically isolated from other strands in the cable 105.

The sensing strands 120 form a sensing circuit that may be characterized as having a known resistance (R-set) or a known range of resistance (R-min to R-max). The sensing strands 120 in the sensing circuit may also have one or more other known characteristics, such as a known capacitance, a known signal attenuation, or a known impedance (Z-set) or known range of impedances (Z-min to Z-max) (where impedance is the effective resistance of a circuit to an AC signal). These characteristics may be established as a known quantity or as a range of quantities (min to max). Although the cable systems are described herein in terms of resistance, the present invention includes both DC (direct current) schemes and AC (alternating current) schemes for sensing, detecting, and measuring the characteristics of a circuit.

Any change in the resistance or other characteristic of the sensing strands 120 present in the cable system 100 may indicate a breakage (complete or partial loss of continuity), an insult (by rubbing or compression, for example), an excess tension (stretching), an excess bending (indicating excess wear-and-tear caused by usage and/or tampering or other insult).

As shown in FIG. 1A, the one or more sensing strands 120 may be looped back and forth along the length of the cable 105. Looping back and forth may be used in order to establish or raise the total known resistance (R-set) to a desired level, making it easier to detect changes in resistance. The sensing strands 120 may also include a fixed resistor 170 or other resistive element, positioned in series with one or more sensing strands 120. In many cable systems, the resistance for a single strand or wire is very low, making it more difficult to detect minor changes in resistance. Adding a fixed resistor 170 raises the known resistance, making it easier to detect changes in resistance. The fixed resistor 170 may be embedded in one or more of the sensing strands 120 or otherwise positioned in series (or in parallel) in order to establish a desired total resistance.

The sensing strands 120 may be arranged in a number of alternating, generally concentric layers, as shown in FIG. 1B. The sensing strands 120 may extend lengthwise along all or part of the cable 105, looping back and forth within or along the outer coating layer that surrounds the one or more working strands 110. Any number of layers of sensing strands 120 may be placed in the coating layer, depending on the desired number of layers, loops, and/or endpoint connections. In the configuration shown in FIG. 1A and FIG. 1B, any interruption of the integrity of the cable 105 by cutting (or any significant compression or pinching of the cable 105) would 'short' the conductive sensing strands 120 together, across any intermediate insulating layers, thereby changing the impedance of the detection path and generating a fault condition. In this aspect, the cable system 100 generates a fault condition that would provide a pre-failure fault message and a warning to users before a catastrophic failure of the working strand 110, indicating that the cable 105 has been significantly compressed, pinched, or otherwise compromised during use. In this aspect, the cable system 100 offers a pre-failure warning for a safety-critical cables 105 or wires, such as those used on elevators, automobiles, aircraft, spacecraft, automobiles, train locomotives, cable cars, and the like.

The first terminal 130 may include a first signal source 160, a first sensor 180, and a first transceiver 190. Likewise, the second terminal 140 may include a second signal source 162, a second sensor 182, and a second transceiver 192. According to one exemplary configuration involves a test signal that is generated by the first signal source 160; accordingly, the second signal source 162 may not be present at the second terminal 140. The test signal may be received by the second sensor 182; accordingly, in this configuration, the first sensor 162 may or may not be present. The second sensor 182 may generate one or more fault messages and relay them to the second transceiver 192 for transmission to a remote receiver 150; accordingly, in this configuration, the first transceiver 190 may or may not be present in the first preferred embodiment of the cable system 100.

In accordance with one exemplary configuration, the first signal source 160 may include a local power source for imparting a test signal such as a known test voltage (V-test) into one or more of the strands 110, 120 and along the sensing path. The test signal may include an electrical signal, such as the test voltage (V-test), or it may include a radio frequency (RF) signal or a light signal (transmitted along fiber optic cable, for example). The power may be provided by an external source, such as a battery, or it may be an active element within the cable system 100 itself (for example, an internal element providing a power source such that the cable 105 itself amplifies or modifies the input voltage (V-test) as part of its function or its characteristic signature). The test signal may be imparted at the first terminal 130 and then sensed at the second terminal 140. In this aspect, the cable system 100 senses and measures the actual resistance (R-actual) of the one or more strands 110, 120 in the cable 105. Any difference between the known resistance (R-set) and the actual resistance (R-actual).

The first signal source 160 may include a signal generator (analog or digital), a function generator, a waveform generator, of any other suitable signal generator known in the art. The first signal source 160 may also include a processor. Under normal operating conditions, the test signal imparted by the first signal source 160 may freely traverse the strands 110, 120 along the sensing path between the terminals 130, 140 and may be sensed or detected by the second sensor 182. When one or more of the strands 110, 120 is insulted or compromised, the test signal may be diminished or eliminated—a condition that is sensed or detected by the second sensor 182. For example, the second sensor 182 may be configured to detect or measure the actual resistance (R-actual) along the sensing path. If the actual resistance (R-actual) is sufficiently different from the known resistance (R-set), then the second sensor 182 and may be further configured to send a fault message to the second transceiver 192 which, in turn, transmits the fault message to a receiver 150. The receiver 150, as shown, may be a device located remote from the cable 105 that is configured to receive and/or send messages wirelessly. The receiver 150 may include one or more indicators 155. Upon receiving the fault message, the receiver 150 may be configured to cause the indicators 155 to illuminate, change color, sound an audible signal, produce a tactile signal such as vibrating, or otherwise generate a sign or indication that a fault message has been detected and received. The receiver 150 may also be configured to send a warning or maintenance message to one or more predetermined users by any of a variety of wireless and wired messaging techniques.

The first signal source 160 may include a local circuit or microchip that is configured to check the condition of the cable 105 by sending the known voltage (V-test) at periodic intervals, to detect whether a fault condition exists and (if so) to illuminate the one or more indicators 155 on the receiver 150. Alternatively, the local circuit or microchip may be configured to sense an interrupt to the circuit, wherein the interrupt indicates a change in resistance that is equal to or greater than a predetermined threshold value. Upon detection of such an interrupt, the local circuit or microchip may be configured to then initiate and send the known voltage (V-test) in order to test the circuit and detect and/or measure the change in condition.

For a cable system that operates using a DC detection scheme, the known voltage (V-test) may be a constant, zero-frequency voltage signal applied to a DC circuit. The resistance R may be the variable to be measured when detecting changes in a DC circuit.

For a cable system that operates using an AC detection scheme, the known voltage (V-test) may be a sinusoidal voltage signal applied to an AC circuit. The impedance Z may be the variable to be measured when detecting changes in an AC circuit. The cable system may include an electrical shield in the outer layers of the cable (like a co-ax cable) in order to prevent or minimize radiated noise. The local circuitry may also be configured to measure the actual resistance (or other electrical characteristic) along the sensing path at a first time (R-actual-T1), such as when the cable system 100 is initially placed in use. Thereafter, the first signal source 160 may be configured to re-measure the actual resistance (or other characteristic) at one or more later times (R-actual-Tn). Any difference between the measured resistances or other characteristics would generate a fault message. The first cable system 100 may also include a local memory, such as an EEPROM or serial EEPROM (SEEPROM), for recording measurements and other data about the condition of the cable system 100.

Connected Receiver

The receiver 150, in another exemplary configuration, may be physically connected to one or both of the first and second terminals 130, 140. For example, the terminals 130, 140 may include pins that are sized and shaped to be inserted into receptacles in the receiver 150. In this configuration, the terminals 130, 140 need not include the wireless transceivers 190, 192. Moreover, in this configuration, the receiver 150 may be configured to provide a signal source (instead of or in addition to the signal sources 160, 162 in the terminals 130, 140 respectively). The receiver 150 may also be configured to sense the test signal along the sensing path (instead of or in addition to the sensors 180, 182 in the terminals 130, 140 respectively).

For this exemplary configuration in which the receiver 150 is physically connected and performs some of all of the functions of the local terminals, the receiver 150 may include a local circuit or microchip that is configured to check the condition of the cable 105 by sending the known voltage (V-test) at periodic intervals, to detect whether a fault condition exists and (if so) to illuminate the one or more indicators 155 on the receiver 150. Alternatively, the local circuit or microchip may be configured to sense an interrupt to the circuit, wherein the interrupt indicates a change in resistance that is equal to or greater than a predetermined threshold value. Upon detection of such an interrupt, the local circuit or microchip may be configured to then initiate and send the known voltage (V-test) in order to test the circuit and detect and/or measure the change in condition.

For a cable system that operates using a DC detection scheme, the known voltage (V-test) may be a constant, zero-frequency voltage signal applied to a DC circuit. The resistance R may be the variable to be measured when detecting changes in a DC circuit.

For a cable system that operates using an AC detection scheme, the known voltage (V-test) may be a sinusoidal voltage signal applied to an AC circuit. The impedance Z may be the variable to be measured when detecting changes in an AC circuit. The cable system may include an electrical shield in the outer layers of the cable (like a co-ax cable) in order to prevent or minimize radiated noise. The local circuitry may also be configured to measure the actual resistance (or other electrical characteristic) along the sensing path at a first time (R-actual-T1), such as when the cable system 100 is initially placed in use. Thereafter, the receiver 150 may be configured to re-measure the actual resistance (or other characteristic) at one or more later times (R-actual-Tn). Any difference between the measured resistances or other characteristics would generate a fault message. The receiver 150 may also include a local memory, such as an EEPROM or serial EEPROM (SEEPROM), for recording measurements and other data about the condition of the cable system 100.

Second Embodiment

Referring to FIG. 2A and FIG. 2B, a cable system 200 according to a second preferred embodiment is illustrated. The second preferred cable system 200 is similar in every way to the first cable system 100 except that the first terminal 230 is located or positioned nearby the second terminal 240, as shown in FIG. 2A. In this orientation, the cable system 200 is arranged in a U-shape like the shackle of a typical padlock.

According to one exemplary configuration, the first and second terminals 230, 240 of the second cable system 200 may be physically connected to the receiver 250. For example, the terminals 230, 240 may include pins that are sized and shaped to be inserted into receptacles in the receiver 250. In this configuration, the second preferred cable system 200 may appear and operate like the U-shaped shackle of a padlock, wherein the pin of each terminal 230, 240 is selectively inserted into the corresponding receptacles in the receiver 250.

In this configuration, the terminals 230, 240 need not include the wireless transceivers 290, 292. Moreover, in this configuration, the receiver 250 may be configured to provide a signal source (instead of or in addition to the signal sources 260, 262 in the terminals 230, 240 respectively). The receiver 250 may also be configured to sense the test signal along the sensing path (instead of or in addition to the sensors 280, 282 in the terminals 230, 240 respectively).

Third Embodiment

Referring to FIG. 3A and FIG. 3B, a combination cable system 300 according to a third preferred embodiment is illustrated. The cable 305, as shown, may include one or more working strands 310 and one or more sensing strands 320. Together, the strands 310, 320 define a sensing path. The strands 310, 320 may be comprised of one or more conductive wires, capable of transmitting an electrical signal.

The one or more sensing strands 320 may be arranged in a number of alternating, generally concentric layers, as shown in FIG. 3B, extending back and forth along the length of the cable 305. Continuity may be tested along the sensing path by making a connection between the first terminal 330 and the second terminal 340. Continuity may also be tested by making a connection between the first terminal 330 and the auxiliary terminal 345 (which is made easier by locating these two terminals 330, 345 near one another, at a single end of the cable 305. The terminals 330, 340, 345 are operably connected to the cable 305.

Interrupts in continuity may indicate a short or a break. Changes in resistance or other characteristic may indicate a partial fault or other change along the path, caused by the presence of an additional or different locking device or accessory, for example. In this aspect, the cable system may be used to detect which type of cable is installed or attached between the pins.

The working strands 310 are described as active or working because they are engaged in performing one or more functions of the cable system 300, such as providing structural support, conveying a mechanical force (for lifting or towing, for example), or carrying an electric current or signal.

The working strands 310 and/or the sensing strands 320 may be fully conductive (such as copper wire, ferrous wire, metal foil, wound wire, or other conductive flexible material) or partially conductive (such as resistive wire, carbon filament, carbon-impregnated rubber, synthetic, or other partially-conductive material)—or some combination of both types. The sensing strands 320 may be insulated and/or electrically isolated from other strands in the cable 305.

The sensing strands 320 form a sensing circuit that may be characterized as having a known resistance (R-set) or a known range of resistance (R-min to R-max). The sensing strands 320 in the sensing circuit may also have one or more other known characteristics, such as a known capacitance, a known signal attenuation, or a known impedance (Z-set) or known range of impedances (Z-min to Z-max) (where impedance is the effective resistance of a circuit to an AC signal). These characteristics may be established as a known quantity or as a range of quantities (min to max). Although the cable systems are described herein in terms of resistance, the present invention includes both DC (direct current) schemes and AC (alternating current) schemes for sensing, detecting, and measuring the characteristics of a circuit.

Any change in the resistance or other characteristic of the sensing strands 320 present in the cable system 300 may indicate a breakage (complete or partial loss of continuity), an insult (by rubbing or compression, for example), an excess tension (stretching), an excess bending (indicating excess wear-and-tear caused by usage and/or tampering or other insult).

As shown in FIG. 3A, the one or more sensing strands 320 may be looped back and forth along the length of the cable 305. Looping back and forth may be used in order to establish or raise the total known resistance (R-set) to a desired level, making it easier to detect changes in resistance. The sensing strands 320 may also include a fixed resistor 370 or other resistive element, positioned in series with one or more sensing strands 320. In many cable systems, the resistance for a single strand or wire is very low, making it more difficult to detect minor changes in resistance. Adding a fixed resistor 370 raises the known resistance, making it easier to detect changes in resistance. The fixed resistor 370 may be embedded in one or more of the sensing strands 120 or otherwise positioned in series (or in parallel) in order to establish a desired total resistance.

The sensing strands 320 may be arranged in a number of alternating, generally concentric layers, as shown in FIG. 3B. The auxiliary terminal 345 is also shown in FIG. 3B.

The third preferred cable system 300 is similar in operation to the first cable system 100. Each of the terminals 330, 340, 345 may include a signal source, a sensor, and a transceiver. The first terminal 330 may include a first signal source 360, a first sensor 380, and a first transceiver 390. The second terminal 340 may include a second signal source 362, a second sensor 382, and a second transceiver 392. The auxiliary terminal 345 may include an auxiliary signal source 364, an auxiliary sensor 384, and an auxiliary second transceiver 394.

In accordance with one exemplary configuration, the first signal source 360 may include a local power source for imparting a test signal such as a known test voltage (V-test) into one or more of the strands 310, 320 and along the sensing path. The power may be provided by an external source, such as a battery, or it may be an active element within the cable system 300 itself (for example, an internal element providing a power source such that the cable 305 itself amplifies or modifies the input voltage (V-test) as part of its function or its characteristic signature). The test signal may be imparted at the first terminal 330 and then sensed at the second terminal 340 and/or at the auxiliary terminal 345. In this aspect, the cable system 300 senses and measures the actual resistance (R-actual) of the one or more strands 310, 320 in the cable 305. Any difference between the known resistance (R-set) and the actual resistance (R-actual).

The first signal source 360 may include a signal generator (analog or digital), a function generator, a waveform generator, of any other suitable signal generator known in the art. The first signal source 360 may also include a processor. Under normal operating conditions, the test signal imparted by the first signal source 360 may freely traverse the strands 310, 320 along the sensing path between the terminals 330, 340, 345 and may be sensed or detected by the second sensor 382 (and/or the auxiliary sensor 384). When one or more of the strands 310, 320 is insulted or compromised, the test signal may be diminished or eliminated—a condition that is sensed or detected by the second sensor 382. For example, the second sensor 382 may be configured to detect or measure the actual resistance (R-actual) along the sensing path. If the actual resistance (R-actual) is sufficiently different from the known resistance (R-set), then the second sensor 382 and may be further configured to send a fault message to the second transceiver 392 which, in turn, transmits the fault message to a receiver 350. The receiver 350, as shown, may be a device located remote from the cable 305 that is configured to receive and/or send messages wirelessly. The receiver 350 may include one or more indicators 155. Upon receiving the fault message, the receiver 350 may be configured to cause the indicators 155 to illuminate, change color, sound an audible signal, produce a tactile signal such as vibrating, or otherwise generate a sign or indication that a fault message has been detected and received.

The first signal source 360 may include a local circuit or microchip that is configured to check the condition of the cable 305 by sending the known voltage (V-test) at periodic intervals, to detect whether a fault condition exists and (if so) to illuminate the one or more indicators 355 on the receiver 350. Alternatively, the local circuit or microchip may be configured to sense an interrupt to the circuit, wherein the interrupt indicates a change in resistance that is equal to or greater than a predetermined threshold value. Upon detection of such an interrupt, the local circuit or microchip may be configured to then initiate and send the known voltage (V-test) in order to test the circuit and detect and/or measure the change in condition.

For a cable system that operates using a DC detection scheme, the known voltage (V-test) may be a constant, zero-frequency voltage signal applied to a DC circuit. The resistance R may be the variable to be measured when detecting changes in a DC circuit.

For a cable system that operates using an AC detection scheme, the known voltage (V-test) may be a sinusoidal voltage signal applied to an AC circuit. The impedance Z may be the variable to be measured when detecting changes in an AC circuit. The cable system may include an electrical shield in the outer layers of the cable (like a co-ax cable) in order to prevent or minimize radiated noise. The local circuitry may also be configured to measure the actual resistance (or other electrical characteristic) along the sensing path at a first time (R-actual-T1), such as when the cable system 300 is initially placed in use. Thereafter, the first signal source 360 may be configured to re-measure the actual resistance (or other characteristic) at one or more later times (R-actual-Tn). Any difference between the measured resistances or other characteristics would generate a fault message. The first cable system 300 may also include a local memory, such as an EEPROM or serial EEPROM (SEEPROM), for recording measurements and other data about the condition of the cable system 300.

The receiver 350, in another exemplary configuration, may be physically connected to one or both of the first and second terminals 330, 340. For example, the terminals 330, 340 may include pins that are sized and shaped to be inserted into receptacles in the receiver 350. In this configuration, the terminals 330, 340 (and 345) need not include the wireless transceivers 390, 392, 394. Moreover, in this configuration, the receiver 350 may be configured to provide a signal source (instead of or in addition to the signal sources 360, 362, 364). The receiver 350 may also be configured to sense the test signal along the sensing path (instead of or in addition to the sensors 380, 382, 384).

Fourth Embodiment

Referring to FIG. 4A and FIG. 4B, a single-ended cable system 400 according to a fourth preferred embodiment is illustrated. The cable 405, as shown, may include one or more working strands 410 and one or more sensing strands 420. Together, the strands 410, 420 define a sensing path. The strands 410, 420 may be comprised of one or more conductive wires, capable of transmitting an electrical signal.

The one or more sensing strands 420 may be arranged in a number of alternating, generally concentric layers, as shown in FIG. 4B, extending back and forth along the length of the cable 405. Continuity may be tested along the sensing path by making a connection between the first terminal 430 and the second terminal 440.

The fourth preferred cable system 400 is similar in operation to the first cable system 100. Each terminal 430, 440 may include a signal source, a sensor, and a transceiver. The first terminal 430 may include a first signal source 460, a first sensor 480, and a first transceiver 490. The second terminal 440 may include a second signal source 462, a second sensor 482, and a second transceiver 492.

Fifth Embodiment

Figure 5B:
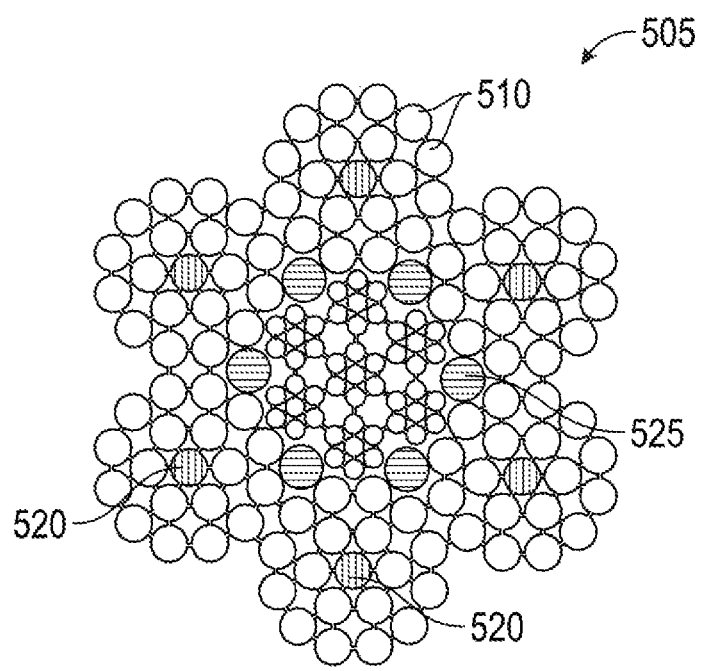
FIG. 5B is a schematic, end view of a cable system in accordance with the fifth preferred embodiment.

Referring to FIG. 5A and FIG. 5B, a spiral-wound, multi-strand cable system according to a fifth preferred embodiment is illustrated. The cable 505, as shown in FIG. 5B, may include one or more working strands 510 and one or more sensing strands 520. Together, the strands 510, 520 define a sensing path. The strands 510, 520 may be comprised of one or more conductive wires, capable of transmitting an electrical signal. The cable 505 may also include filler strands 525 and/or open spaces between the one or more groups of working and sensing strands 510, 520.

This disclosure also describes methods of detecting fault conditions in cable or cable systems. In general, the methods comprise providing a sensing path, imparting a test signal along the sensing path between a first terminal and a second terminal, sensing the test signal, transmitting the test signal or a fault message to a receiver, and activating an indicator to inform or alert users about the condition of the cable. The methods may be used in accordance with any of the embodiments and configurations described herein.

Although several embodiments have been described herein, those of ordinary skill in art, with the benefit of the teachings of this disclosure, will understand and comprehend many other embodiments and modifications for this technology. The invention therefore is not limited to the specific embodiments disclosed or discussed herein. Many other embodiments and modifications are intended to be included within the scope of the appended claims. Moreover, although specific terms are occasionally used herein, as well as in the claims that follow, such terms are used in a generic and descriptive sense only, and should not be construed as limiting the claims or the described invention.

The invention claimed is:

1. A cable system comprising:
a cable comprising a working strand connected to a sensing strand to define a sensing path, wherein said sensing strand is arranged in a plurality of generally cylindrical layers at least partially surrounding and concentric with said working strand;
a first terminal operably connected to said working strand and comprising a first signal source supported by a power source and configured to impart a test signal (V-test) into said sensing path;
a second terminal operably connected to one of said plurality of cylindrical layers of said sensing strand and comprising a second sensor and a second transceiver, wherein said second sensor is configured to detect an electrical value associated with said test signal; and
a receiver in communication with said second transceiver, said receiver comprising an indicator and a local circuit configured to perform the steps of:
(a) determining whether said electrical value is different from a known electrical characteristic associated with said cable; and
(b) in response to determining that said electrical value is different from said known electrical characteristic, sending a fault message to said indicator.

2. The cable system of claim 1, wherein said first terminal further comprises a first sensor and a first transceiver.

3. The cable system of claim 1, wherein said second terminal further comprises a second signal source.

4. The cable system of claim 2, wherein said receiver is in wireless communication with at least one of said first and second transceivers.

5. The cable system of claim 1, wherein said indicator is selected from the group consisting of a lamp, a loudspeaker, and a vibrator.

6. The cable system of claim 1,
wherein said first terminal comprises a first pin sized and shaped to be selectively received with a corresponding first receptacle in said receiver, and
wherein said second terminal comprises a second pin sized and shaped to be selectively received with a corresponding second receptacle in said receiver,
such that said receiver is in wired communication with at least one of said first and second transceivers.

7. The cable system of claim 1, further comprising an auxiliary terminal operably connected to said sensing path, positioned near said first terminal, and configured to substantially duplicate the functions and operation of said second terminal.

8. The cable system of claim 1, wherein said cable further comprises an outer sheath and a plurality of insulating layers disposed between said working strand and each of said plurality of generally cylindrical layers of said sensing strand;
wherein said cable extends from said first terminal, lengthwise in a first direction, to said second terminal;
wherein said working strand extends from its operable connection to said first terminal, lengthwise in said first direction, to an open end located near but not in contact with said second terminal;
wherein said plurality of generally cylindrical layers of said sensing strand comprises an inner layer, a radial transition, and an outer layer, wherein said radial transition is characterized by an annular fold;
wherein said inner layer is operably connected to said open end of said working strand and extends therefrom, lengthwise in opposition to said first direction, to said radial transition which is located at a first intermediate position near said first terminal; and wherein said outer layer extends from said radial transition near said first intermediate position, lengthwise in said first direction, to its operable connection to said second terminal.

9. The cable system of claim 1, wherein said test signal (V-test) comprises a direct-current (DC) voltage,
wherein said known electric characteristic comprises a known resistance (R-set), and
wherein said electrical value comprises an actual resistance (R-actual).

10. The cable system of claim 9, wherein said cable further comprises a fixed resistor connected to said sensing strand, said resistor configured to establish said known resistance (R-set).

11. The cable system of claim 1, wherein said test signal (V-test) comprises an alternating-current (AC) voltage,
wherein said known electric characteristic comprises a range of known impedances between a minimum impedance (Z-min) and a maximum impedance (Z-max), said range including a known impedance (Z-set), and
wherein said electrical value comprises an actual impedance.

12. The cable system of claim 1, wherein said test signal (V-test) comprises an alternating-current (AC) voltage,
wherein said known electric characteristic comprises a known capacitance, and
wherein said electrical value comprises an actual capacitance.

13. The cable system of claim 1, wherein said receiver further comprises a memory configured to store a plurality of values associated with said cable, each of said values associated with a timestamp;
wherein said test signal (V-test) comprises:
(a) a first test signal at a first time (T1), and
(b) a later test signal at a later time (Tn); and
wherein said electrical value comprises:
(a) a first electrical value associated with said first test signal, and
(b) a later electrical value associated with said later test signal.

14. The cable system of claim 13, wherein said local circuit is further configured to perform the steps of:
at said first time, directing said first signal source to impart said first test signal;
directing said second sensor to detect said first electrical value;
storing said first time, said first test signal, and said first electrical value in said memory;
at said later time, directing said first signal source to impart said later test signal;
directing said second sensor to detect said later electrical value; and
storing said later time, said later test signal, and said later electrical value in said memory.

* * * * *